(12) United States Patent
Kundaliya et al.

(10) Patent No.: US 12,327,978 B2
(45) Date of Patent: Jun. 10, 2025

(54) SEMICONDUCTOR LIGHT SOURCE WITH A MIRROR COATING AND METHOD

(71) Applicant: OSRAM Opto Semiconductors GmbH, Regensburg (DE)

(72) Inventors: Darshan Kundaliya, Middleton, MA (US); Alan Lenef, Belmont, MA (US); Thomas Dreeben, Swampscott, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 869 days.

(21) Appl. No.: 17/483,514

(22) Filed: Sep. 23, 2021

(65) Prior Publication Data

US 2023/0086879 A1 Mar. 23, 2023

(51) Int. Cl.
*H01S 5/00* (2006.01)
*H01S 5/02257* (2021.01)
(Continued)

(52) U.S. Cl.
CPC .......... *H01S 5/0071* (2013.01); *H01S 5/0087* (2021.01); *H01S 5/0092* (2013.01); *H10H 20/8514* (2025.01); *H10H 20/8516* (2025.01); *H10H 20/855* (2025.01); *H10H 20/856* (2025.01); *H01S 5/02257* (2021.01); *H10H 20/0363* (2025.01); *H10H 20/851* (2025.01);
(Continued)

(58) Field of Classification Search
CPC .... H01S 5/0071; H01S 5/0087; H01S 5/0092; H01L 33/505; H01L 33/508; H01L 33/60; H01L 2933/0083; H01L 33/507; H01L 33/46; H01L 2933/0025
See application file for complete search history.

(56) References Cited

U.S. PATENT DOCUMENTS 5,469,018 A 11/1995 Jacobsen et al.
6,649,432 B1 11/2003 Eilers et al.
(Continued)

FOREIGN PATENT DOCUMENTS

EP 1887634 A2 2/2008
WO 2016198598 A1 12/2016

OTHER PUBLICATIONS

Gorsky S., et al., "Engineered Hyperuniformity for Directional Light Extraction," APL Photonics, 4, 110801 (2019); Nov. 1, 2019, 14 pages.
(Continued)

*Primary Examiner* — M. A. Golub-Miller
(74) *Attorney, Agent, or Firm* — Slater Matsil, LLP (57) ABSTRACT

In an embodiment a semiconductor light source includes an optoelectronic semiconductor chip configured to emit radiation and a cover body arranged on the optoelectronic semiconductor chip, wherein the cover body comprises a light-transmissive base body, wherein the light-transmissive base body comprises a plurality of recesses with inclined side faces, the recesses start at an emission side of the light-transmissive base body remote from the optoelectronic semiconductor chip and narrow towards the optoelectronic semiconductor chip, wherein a mirror coating is provided at top regions of the recesses next to the emission side, and wherein bottom regions of the recesses closest to the optoelectronic semiconductor chip are free of the mirror coating.

18 Claims, 7 Drawing Sheets

(51) Int. Cl.
  *H10H 20/01*   (2025.01)
  *H10H 20/80*   (2025.01)
  *H10H 20/851*  (2025.01)
  *H10H 20/855*  (2025.01)
  *H10H 20/856*  (2025.01)
(52) U.S. Cl.
  CPC ......... *H10H 20/872* (2025.01); *H10H 20/882* (2025.01)

(56) References Cited

U.S. PATENT DOCUMENTS

| | | | |
|---|---|---|---|
| 8,354,682 | B2 | 1/2013 | Eberhard et al. |
| 8,884,330 | B2* | 11/2014 | Raukas .............. H10H 20/8514 257/79 |
| 9,318,875 | B1* | 4/2016 | Goutain ..................... F21K 9/64 |
| 9,373,761 | B2* | 6/2016 | Kundaliya ............. H10H 20/01 |
| 10,551,728 | B1* | 2/2020 | Novotny ............... H01S 5/0071 |
| 10,768,314 | B2 | 9/2020 | Houha et al. |
| 10,862,008 | B2* | 12/2020 | Kundaliya ......... H10H 20/8512 |
| 11,294,195 | B2* | 4/2022 | Dal Negro ................ F21K 9/65 |
| RE50,041 | E * | 7/2024 | Hirasawa ................... F21V 7/30 |
| 2008/0042153 | A1* | 2/2008 | Beeson .................. H05B 33/10 257/E33.001 |
| 2011/0025190 | A1* | 2/2011 | Jagt ...................... H10H 20/855 313/499 |
| 2011/0090696 | A1* | 4/2011 | Nagai ................ H10H 20/8514 362/293 |
| 2012/0068615 | A1 | 3/2012 | Duong et al. |
| 2014/0084325 | A1* | 3/2014 | Yamanaka ........... G02B 3/0062 362/326 |
| 2015/0078010 | A1* | 3/2015 | Kundaliya ................ F21V 9/38 204/489 |
| 2016/0238203 | A1* | 8/2016 | Lenef ...................... H01S 5/183 |
| 2017/0234506 | A1* | 8/2017 | Lee ........................... F21K 9/66 362/84 |
| 2017/0363269 | A1* | 12/2017 | Sano ....................... F21V 29/70 |
| 2018/0080631 | A1* | 3/2018 | Sano .................. C09K 11/7706 |
| 2018/0166424 | A1* | 6/2018 | Sim ...................... H10H 20/853 |
| 2018/0212398 | A1* | 7/2018 | Fukakusa ............. H10H 20/851 |
| 2019/0013642 | A1* | 1/2019 | Stojetz .................. H01S 5/4087 |
| 2019/0052052 | A1* | 2/2019 | Takahira ............. H01S 5/32341 |
| 2019/0056546 | A1* | 2/2019 | Vrehen ................ G02B 6/0085 |
| 2019/0181302 | A1* | 6/2019 | Brick .................... H01L 33/502 |
| 2020/0335667 | A1* | 10/2020 | Deckers ............. H10H 20/8514 |
| 2021/0265540 | A1* | 8/2021 | Itou .................... H10H 20/8514 |
| 2021/0296530 | A1* | 9/2021 | Bailey .................. H10H 20/841 |
| 2021/0376200 | A1* | 12/2021 | Kim .................... H10H 20/8513 |
| 2022/0010202 | A1* | 1/2022 | Yamashita ............. C09K 11/02 |
| 2022/0029069 | A1* | 1/2022 | Chang ................ H10H 20/8513 |
| 2022/0316663 | A1* | 10/2022 | Wildeson ............ H01L 25/0753 |
| 2022/0393078 | A1* | 12/2022 | Cheng .................. H10H 20/855 |
| 2023/0231089 | A1* | 7/2023 | Kreiner ................ H10H 20/855 257/40 |
| 2023/0261158 | A1* | 8/2023 | Moriyama ........... H10H 20/819 257/79 |
| 2023/0275182 | A1* | 8/2023 | Tamaki ................ H10H 20/855 257/79 |

OTHER PUBLICATIONS

Gorsky, S., et al., "Directional Light Emission Enhancement from LED-Phosphor Converters Using Dielectric Vogel Spiral Arrays," APL Photonics 3, 126103 (2018), Dec. 4, 2018, 13 pages.

Enef, A., et al., "Light Extraction from Luminescent Light Sources and Application to Monolithic Ceramic Phosphors," Optics Letters, vol. 39, No. 10, May 15, 2014, 4 pages.

Lenef, A., et al., "Thermodynamics of Light Extraction from Luminescent Materials," JSS Focus Issue on Visible and Infrared Phosphor Research and Applications, ECS Journal of Solid State Science and Technology, 7 (1) R3211-R3226, Jan. 2, 2018, 17 pages.

Qu Y., et al."Polarization-Independent Optical Broadband Angular Selectivity," ACS Photonics, Aug. 31, 2018, 7 pages.

Haiding, S., et al., "Enhancement of Yellow Light Extraction Efficiency of Y3Al5O12:Ce3+ Ceramic Converters Using a 2-D TiO2 Hexagonal-Lattice Nanocylinder Photonic Crystal Layer," IEEE Photonics Journal, vol. 8, No. 1, Feb. 19, 2016, 11 pages.

Yariv, A. et al., "Optical Waves in Crystals," Propagation and Control of Laser Radiation, A Wiley-Interscience Publication, Nov. 1984, 4 pages.

* cited by examiner

SEMICONDUCTOR LIGHT SOURCE WITH A MIRROR COATING AND METHOD

TECHNICAL FIELD

The disclosure relates to a semiconductor light source. The disclosure further relates to a cover body for such a semiconductor light source.

SUMMARY

Embodiments provide a semiconductor light source that has improved emission characteristics.

According to at least one embodiment, the semiconductor light source comprises one or a plurality of optoelectronic semiconductor chips. The at least one optoelectronic semiconductor chip is configured to emit radiation. For example, the at least one optoelectronic semiconductor chip is a light-emitting diode chip, LED chip for short, or a laser diode chip. It is possible that different kinds of optoelectronic semiconductor chips are present in the semiconductor light source.

According to at least one embodiment, the at least one optoelectronic semiconductor chip is configured to emit near-ultraviolet radiation or visible light. For example, a peak wavelength of the radiation emitted by the at least one optoelectronic semiconductor chip is at least 360 nm and/or is at most 680 nm. In particular, the at least one optoelectronic semiconductor chip is configured to emit blue light having a peak wavelength of at least 435 nm and/or of at most 485 nm.

According to at least one embodiment, the semiconductor light source comprises one or a plurality of cover bodies. The at least one cover body is applied directly or indirectly on the optoelectronic semiconductor chip. For example, the at least one cover body is configured to narrow an emission angle of radiation emitted at the emission side.

According to at least one embodiment, the cover body comprises a base body. The base body is light-transmissive. Preferably, the base body is transparent, but it is also possible that the base body is hazy.

According to at least one embodiment, for example, seen in at least one cross-section perpendicular to the emission side, the light-transmissive base body comprises a plurality of recesses with inclined side faces. The recesses start at an emission side of the light-transmissive base body remote from the optoelectronic semiconductor chip. The recesses narrow towards the optoelectronic semiconductor chip.

According to at least one embodiment, the cover body comprises a mirror coating. The mirror coating is provided only on top regions of the recesses next to the emission side. Thus, bottom regions of the recesses closest to the optoelectronic semiconductor chip are free of the mirror coating. The mirror coating is reflective for the radiation the cover body is configured for.

For example, a reflectivity for said radiation is at least 85% or is at least 95% or is at least 98%. Preferably, for said radiation there is no particular spectral dependency of the reflectivity. That is, with a tolerance of at most 10 percentage points or of at most 5 percentage points, the reflectivity of the mirror coating is the same for all wavelengths of the radiation the cover body is configured for.

In at least one embodiment, the semiconductor light source comprises an optoelectronic semiconductor chip configured to emit radiation and a cover body applied on the optoelectronic semiconductor chip. The cover body comprises a light-transmissive base body. Seen in cross-section, the light-transmissive base body comprises a plurality of recesses with inclined side faces, the recesses start at an emission side of the light-transmissive base body remote from the optoelectronic semiconductor chip and narrow towards the optoelectronic semiconductor chip. A mirror coating is provided on top regions of the recesses next to the emission side, bottom regions of the recesses closest to the optoelectronic semiconductor chip are free of the mirror coating.

In many solid-state lighting, SSL, applications, blue pump LEDs excite a phosphor plate, also referred to as wavelength conversion means, to generate longer wavelength emission that may either be combined with the unabsorbed blue light transmitted through the phosphor for white light generation or used alone, with the blue light fully absorbed. In the case of phosphor converted LEDs, the emission spectrum is usually much broader than direct LED emission. In some cases, blue diode lasers can be the phosphor excitation source and are called laser-activated remote phosphor, LARP, sources; these also have broad spectral emission.

For example, in projection applications, light collection efficiency by an upstream optical system is limited by the source étendue. For SSL projection applications based on LEDs or LARP sources, light is emitted in a full hemisphere, usually close to a Lambertian radiant intensity pattern. The design of lenses or mirrors to collect the full hemispherical angular distribution of light emitted by such a device is a difficult problem. In practice, the collection/collimating optics will collect light only up to a certain angular cone, such as ±60°, significantly reducing system efficiency. Efficiency could be increased by using optics that collect at higher angles, but this greatly increases physical size and weight of the optical system.

Obtaining directed angular emission from an excited phosphor plate, such as a ceramic phosphor or powder in a matrix plate bonded to a blue LED, is challenging if the source étendue is not to be increased. In fact, when trying to design a general optical surface structure on top of the phosphor converter which restricts the angular emission, losses in the LED chip will always cause some loss in radiant or luminous flux. This occurs as a consequence of a fundamental limit on transmission through structured surfaces from a light generating medium of refractive index n2 into an output or exitant medium, like air, with lower refractive index n1.

In the semiconductor light source described herein, the problem of collection efficiency by angular acceptance-limited secondary optics is solved by providing a method to generate directional emission from, for example, a phosphor converted LED or LARP source. Moreover, a method for generating directional emission over a broad spectral range without wavelength dependent angular emission behavior is provided. The net effect is to reduce source étendue by decreasing an emission angle and therefore increasing coupling efficiency into an étendue-limited optical system. This increases source radiance and/or luminance. This implies that more radiation can be collected by the downstream collection/collimation optics, increasing system efficiency.

Such an approach is different than just applying a silicone lens to a phosphor emitting surface, as this increases source étendue. As directionality obtained in the semiconductor light source described herein is broadband in nature, this approach is particularly applicable to directional emission for white converted LED chips used, for example, in automotive or projection applications. It can also be used for phosphor converted green channels in LED RGB projection, or medical applications such as optical fiber endoscopes which require both low étendue with high quality broadband spectra. In practice, such a light source will generate more luminous or radiant flux into a desired emission cone compared to a standard Lambertian source.

For example, a light-emitting diode, LED, chip generates short wavelength pump light, which can be blue emission from an InGaN LED chip. This pump light excites a wavelength conversion means, also referred to as phosphor, to generate longer wavelength converted light. An LED package can provide phosphor emission only or combined pump light and phosphor emission to generate white light. These are normally called full conversion and partial conversion LEDs. The degree of pump light transmission is controlled by the absorption properties of the phosphor, volume scattering in the wavelength conversion means, surface scattering from various structures in the package, reflective surfaces, such as mirrors on the LED chip, Fresnel surfaces, and emission confinement structures such as TiO2 filled silicone to recycle a side emission from the phosphor and chip.

Especially, a blue emitting InGaN chip is combined with Ce:GdYAG phosphor to generate white light in a partial conversion configuration. Combination of an InGaN chip with more strongly absorbing Ce:LuAG phosphors can generate green emission. Typical wavelength conversion means may comprise ceramic phosphors, powder phosphor in silicone, epoxy, polysiloxane or other robust organic matrix materials, or monocrystalline phosphors. The wavelength conversion means may comprise any known phosphor material, including Ce3+ or Eu2+ doped oxides and nitrides, quantum dot phosphors, infra-red phosphors.

To maintain lowest étendue, it is desirable that both the phosphor and the LED chip have a planar geometry. The LED chip usually has an extraction structure on its emitting side and a high reflectivity mirror on the opposite side to recycle all scattered pump and converted light back towards a forward direction. However, the LED chip could also include a substrate such as sapphire, whereby reflective surfaces on the sides and bottom of the LED chip redirect light towards the wavelength conversion means. Such LED chips can also be operated in a so-called flip-chip configuration in which the forward emission is through the substrate. The wavelength conversion means is bonded to the LED chip using, for example, a bonding material such as silicone glue. The emitting surface of the wavelength conversion means can be the native surface, a polished surface, or possibly a roughened surface.

Generally, a refractive index of the wavelength conversion means is higher than the exitant medium which is usually air. The exitant medium could also be a material such as silicone to couple light into other optical structures. In some cases, the phosphor emitting surface may be covered by an intermediate encapsulation material to protect against environmental conditions such as humidity or corrosive gases. Light extraction into the exitant medium is accomplished, for example, through volume scattering in the phosphor, rough or structured surface scattering on the emitting side of the wavelength conversion means, scattering from the LED extraction structure and mirror, or any combination of these extraction mechanisms.

In the case of polished emitting surfaces of the wavelength conversion means, light emission into the exitant medium of both pump and converted light is limited by the critical angle condition for rays inside the wavelength conversion means. Rays beyond the critical angle undergo total internal reflection, TIR, and are recycled by the various internal extraction structures and scattering mechanisms, where they may make another attempt at exiting the phosphor. Rays which lie within the critical angle cone will exit the phosphor into the exitant medium into a full hemisphere, usually having a luminous or radiant intensity distribution that is close to Lambertian.

Preferably, the semiconductor light source described herein includes three technical features that provide a solution to the problem of obtaining directed angular emission with a net efficiency gain compared to an optimized forward emitting LED or converted LED emitting into a restricted angular cone. While the main application of the semiconductor light source is to broadband emitters, such as converted LEDs, the principle applies to both direct LED sources and converted LEDs, and even non-LED or LARP applications.

For example, the semiconductor light source relies on a surface structure, also referred to as a cover body, that is applied directly to the emitting surface of the converted LED phosphor plate. A variety of methods can be used to either bond a separate structured surface or to create the surface directly on the LED phosphor plate. The surface can even be embossed or otherwise structured directly into the phosphor, without restrictions on volume scattering.

Thus, the semiconductor light source described herein does not require special phosphor conditions, such as a non-scattering monocrystalline material, that are expensive to mass produce. It can be used with nearly any scattering phosphor. The phosphor absorption properties and therefore color can further be tuned by the usual methods such as increasing scattering or phosphor particle loading.

For example, the surface structures take on pyramidal shapes, typically in the 10's of micron scale range, to avoid strong unwanted diffractive effects that could lead to artifacts and stronger wavelength dependence. That is, the structured surface is basically a refractive component and may not be regarded as a component prone to wave optics.

Thus, the semiconductor light source described herein preferably makes use of an additional application of a high-reflectivity mirror coating on upper portions of the surface structure to form a hard boundary for transmission of high-angle rays. The mirror coatings should be of a dielectric type to avoid losses which may be multiplied due to the recycling effects of the mirrors.

With the cover body, nearly wavelength independence can be achieved, relying only on a broadband high-reflectivity coating that is applied to the upper portions of the structured surface. This can be done by a variety of lithographic or imprint techniques. For example, the surface structure is applied directly to the emitting surface of the LED phosphor plate, implying that a variety of methods can be used to either bond a separate structured surface or to create the surface structure directly on the phosphor plate.

The surface structure can be made using a number of methods like embossing, molding, or gray-scale lithography Techniques. The mirror coating can be made using CVD or other conformal deposition techniques, where a barrier material may first be applied to the valleys of the surface structure and a lift-off procedure may be applied after coating.

Further, a wafer level processing can be used.

By means of the cover body, directional emission from solid-state incoherent light sources such as converted LEDs, unconverted LEDs, LARP sources can be generated, or can be used downstream from an illumination source in an optical projection system, such as a fiber-based endoscope.

According to at least one embodiment, the recesses are of pyramidal shape or of conical shape, or have the shape of a truncated cone or of a truncated pyramid. The cone or truncated cone can have a circular or ellipsoid base area, for example.

According to at least one embodiment, a height of the mirror coating is between 5% and 50% inclusive or is between 10% and 40% inclusive or is between 15% and 30% inclusive of an overall height of the recesses. For example, the overall height of the recesses is between 5 µm and 50 µm inclusive or is between 10 µm and 35 µm inclusive.

According to at least one embodiment, seen in cross-section, a half-angle between the inclined side faces of the recesses is between 12° and 35° inclusive or is between 15° and 25° inclusive. Thus, the recesses can be tapered with an acute angle.

According to at least one embodiment, the semiconductor light source further comprises a wavelength conversion means configured to convert at least part of the radiation that the optoelectronic semiconductor chip is configured to emit into a secondary radiation. The wavelength conversion means is arranged between the optoelectronic semiconductor chip and the cover body.

According to at least one embodiment, the wavelength conversion means is a plane-parallel plate. For example, the cover body is attached to the wavelength conversion means by means of a first adhesive arranged between the cover body and the wavelength conversion means.

According to at least one embodiment, the cover body comprises a bottom recess on a side opposite the plurality of recesses. Preferably, there is exactly one large bottom recess. The bottom recess faces the wavelength conversion means. The bottom recess is surrounded by a rim, in particular, by a closed rim. By means of the bottom recess, an air gap can be located between the cover body and the wavelength conversion means.

According to at least one embodiment, the wavelength conversion means is partially or completely located in the bottom recess. That is, the wavelength conversion means can partially or completely be surrounded by the rim. Alternatively, the rim is applied on a side of the wavelength conversion means facing the cover body so that the bottom recess can completely be located on a side of the wavelength conversion means remote from the semiconductor chip.

According to at least one embodiment, the cover body comprises a wavelength conversion material configured to convert at least part of the radiation that the optoelectronic semiconductor chip is configured to emit into a secondary radiation. In other words, the cover body can be the wavelength conversion means.

According to at least one embodiment, the mirror coating is a broadband dielectric multilayer mirror. Additionally or as an alternative, the mirror coating can comprise a metallic reflection layer, for example, made of silver or aluminum.

According to at least one embodiment, seen in top view of the emission side, the recesses are of rectangular, trigonal, hexagonal, elliptic or circular fashion. For example, the recesses are shaped as an equilateral triangle, as a square, or as a regular hexagon.

According to at least one embodiment, seen in cross-section, the recesses are of symmetrical fashion. For example, there is an axis of mirror symmetry for the respective recess perpendicular to the emission side.

According to at least one embodiment, the recesses run through at least 50% or through at least 70% or through at least 90% or through at least 98% of the light-transmissive base body, in a direction perpendicular to the emission side. That is, a depth of the recesses may be about the same as a thickness of the light-transmissive base body.

According to at least one embodiment, out of the recesses the emission side is flat. That is, the only unevenness of the emission side may be caused by the recesses, and otherwise the emission side is planar.

According to at least one embodiment, seen in top view of the emission side, a period length of a pattern of the recesses is between 10 µm and 0.1 mm inclusive or is between 15 µm and 50 µm inclusive.

According to at least one embodiment, seen in top view of the emission side, the recesses are arranged in a hexagonal or rectangular grid.

A cover body is additionally provided. The cover body is configured for a semiconductor light source, as indicated in connection with at least one of the above-stated embodiments. Features of the semiconductor light source are therefore also disclosed for the cover body and vice versa.

In at least one embodiment, the cover body is configured for a semiconductor light source and comprises a light-transmissive base body and a mirror coating,
  wherein, seen in cross-section, the light-transmissive base body comprises a plurality of recesses with inclined side faces, the recesses start from an emission side of the light-transmissive base body and narrow in a direction away from the emission side, and
  wherein the mirror coating is provided only on top regions of the recesses next to the emission side, such that bottom regions of the recesses remote from the emission side are free of the mirror coating.

A method for manufacturing the cover body is additionally provided. By means of the method, a cover body can be produced as indicated in connection with at least one of the above-stated embodiments. Features of the method are therefore also disclosed for the method and vice versa.

In at least one embodiment, the method is to produce a cover body and comprises: providing a light-transmissive base plate,
  forming the recesses into the light-transmissive base plate so that the light-transmissive base body is created, and
  applying the mirror coating on the top regions of the recesses.

According to at least one embodiment, the applying the mirror coating on the top regions of the recesses includes, preferably in the stated order:
  completely providing the recesses with the mirror coating,
  providing a mask layer on the mirror coating,
  removing the mirror coating from the bottom regions, and
  removing the mask layer.

According to at least one embodiment, a plurality of the light-transmissive base bodies and the assigned mirror coating are produced on a wafer level, followed by a dicing into the individual light-transmissive base bodies.

A semiconductor light source, a cover body and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

DETAILED DESCRIPTION OF ILLUSTRATIVE EMBODIMENTS

Figure 1:
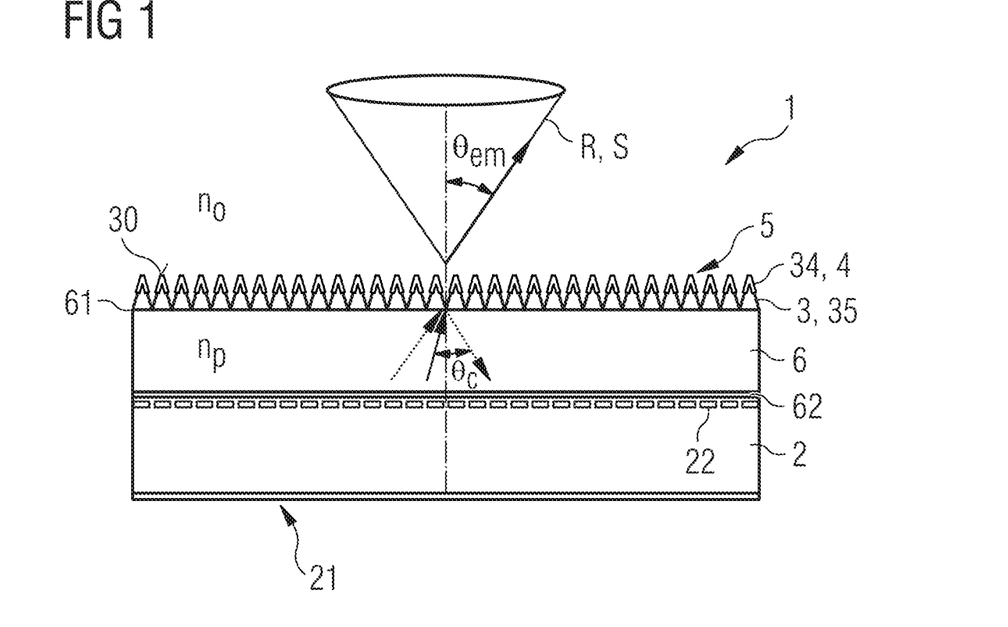
FIGS. 1 and 2 are schematic sectional views of exemplary embodiments of semiconductor light sources described herein.
Figure 2:
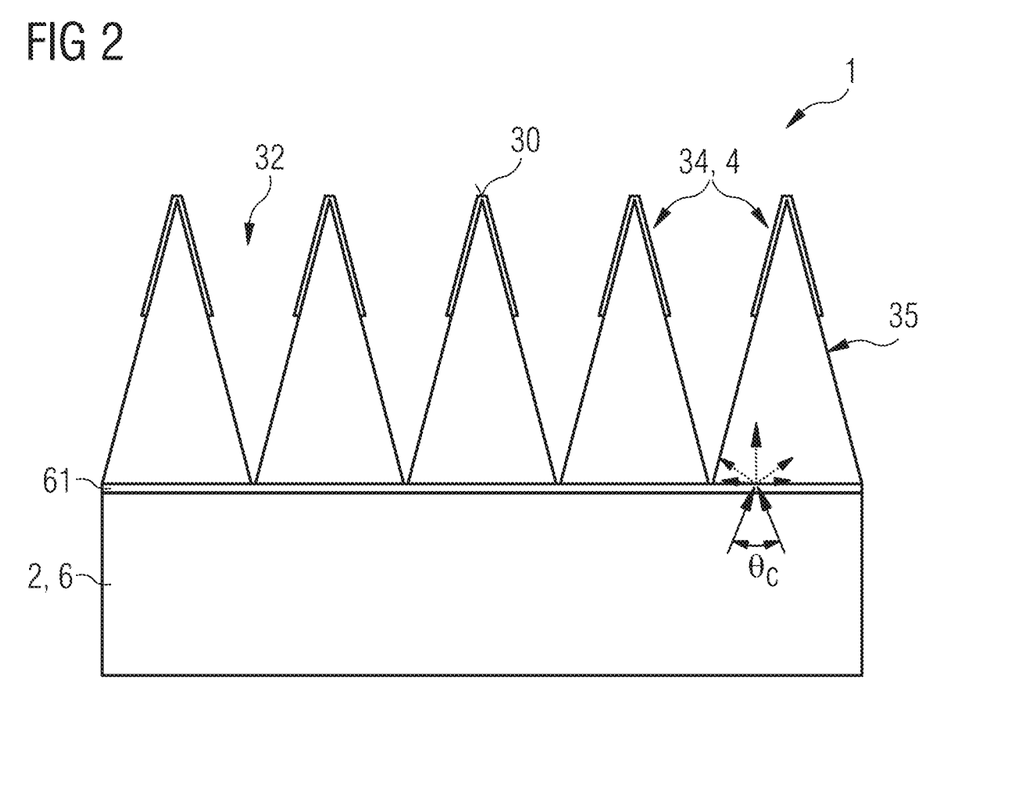
Figure 3:
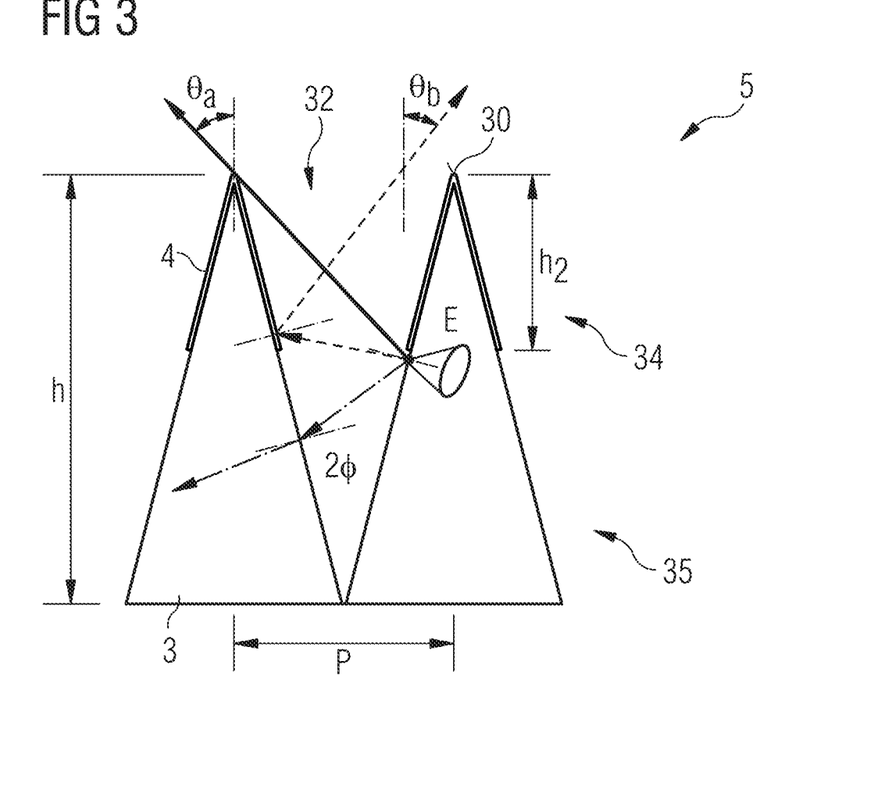
FIG. 3 is a schematic sectional view of an exemplary embodiment of a cover body for semiconductor light sources described herein.

In FIGS. 1 to 3, a semiconductor light source 1 having a cover body 5 and the respective cover body 5 are illustrated. In addition to the cover body 5, the semiconductor light source 1 includes an optoelectronic semiconductor chip 2 which is, for example, an LED chip configured to emit blue light as a radiation R. Further, between the optoelectronic semiconductor chip 2 and the cover body 5 there is a wavelength conversion means 6 configured to produce, for example, yellow light from a part of the radiation R so that secondary radiation S is emitted.

The optoelectronic semiconductor chip 2 may be attached to the wavelength conversion means 6 with a second adhesive 62, and the wavelength conversion means 6 may be attached to the cover body 5 with a first adhesive 61. The adhesives 61, 62 are, for example, silicone glues. If the respective surfaces are optically smooth, other bonding techniques, such as wafer bonding, may be used. High temperature bonding techniques may also be used including low-temperature glass bonding or ceramic-based cermet bonds. As a further option, the optoelectronic semiconductor chip 2 may comprise a back side mirror 21 and a chip extraction structure 22.

The cover body 5 comprises a transparent base body 3 and a mirror coating 4. The base body 3 comprises a plurality of recesses 32 that may completely or virtually completely run through the base body 3 from an emission side 30 towards the wavelength conversion means 6. The recesses 32 are, for example, pyramids. Top regions 34 of the base body 3 next to the emission side 30 are provided with the mirror coating 4 while bottom regions 35 adjacent to the optoelectronic semiconductor chip 2 are free of the mirror coating 4. In a direction perpendicular to the emission side, for example, the top regions 34 amount to a quarter or to a third of a depth of the recesses 32.

For example, the wavelength conversion means 6 is a ceramic plate comprising at least one phosphor like Ce:YAG. Thus, the wavelength conversion means 6, which may also be referred to as a phosphor plate, has a comparably high refractive index $n_p$, compared with the refractive index $n_o$ of surrounding air. Consequently, there is a cutoff angle $\theta_c$ concerning total internal reflection at a side of the wavelength conversion means 6 facing the cover body 5.

By means of the cover body 5, a maximum emission angle $\theta_{em}$ is decreased. This is explained below in more detail with reference to FIGS. 2 and 3.

Hence, according to FIGS. 1 to 3, the cover body 5 provides a transmissive structured surface with, for example, a pyramidal shape attached to the surface of the phosphor plate 6. The top regions 34 of the structure have the mirror coating 4 to restrict high angle rays that would otherwise be transmitted into the surrounding air or exitant medium.

FIGS. 2 and 3 show a more detailed view of the surface structure configuration. The structure consists of the transparent base body 4 which takes on the shape of pyramidal structures as the recesses 32. The surface structure material may consist of a variety of transparent or even partially scattering but lossless materials such as fused silica, PMMA, silicone, glasses, or ceramics such as undoped YAG, alumina, and many other inorganic and organic transparent or partially scattering media. The structures 3, 32 can be made by a variety of methods including imprinting or molding, multilevel or gray level lithography, injection molding, laser patterning, and other techniques. Other methods for fabricating such surface structures 32 may include fabrication of the structures after application of the surface structure material. This may include application of a thick film, that is, with a thickness of at least 10 μm, of a polymer such as PMMA or silicone, followed by imprinting, wafer-level patterning, for example, by means of gray or multi-level lithography, or laser patterning. In the case of organic materials, a curing process may be required.

The partial mirror coating 4 can be applied using CVD, ALD, or other conformal dielectric thin-film deposition processes. For light inside the surface structure 3, 32, the mirror coating 4 should be highly reflective for all angles up to the critical angle $\theta_c$ for light exiting the pyramid surfaces 3, 32. The mirror coating 4 extends only partially from the uppermost feature of the surface structure 3, 32. In two dimensions, this corresponds to the pyramid apex. The fabrication of the reflective coatings can be accomplished by several methods, including partially filling the structure 3, 32 with a resist or other temporary barrier material. The barrier material can be again applied using soft-imprint techniques, ultraviolet lithography to cure only the valley regions, or other methods.

Generally, for wavelengths in the visible spectrum, metal or dielectric-enhanced metal coatings are possible for the mirror coating 4, but not preferred due to the comparably high losses generated. The strong light recycling effects of the mirror coating 4 tend to amplify the losses and degrade the directional efficiency advantage. By using dielectric thin films for the mirror coating 4, imperfect reflection implies some transmission of light through the coating 4. While this can degrade the angular performance a bit, it will not reduce overall efficacy or efficiency of the semiconductor light source 1.

The operation of cover body 5 is most easily understood in two dimensions. Referring to FIG. 3, an internal light distribution inside a two-dimensional pyramid is considered. The pyramids have a total height h. The vertical extent of the mirror coating 4 from the apex of the pyramid is denoted by h2. A pitch between pyramids is denoted by P and determined by the apex full angle 2ϕ from simple geometry. The relationship is given by tan ϕ=P/2h.

As scattering from the semiconductor chip 2, the phosphor plate 6, and recycling reflections from the mirror coating 4 tend to create an internal Lambertian spectral radiance distribution inside a given pyramid, one can assume that the internal light incident on an uncoated surface of the pyramid is close to Lambertian. Referring again to FIG. 3, only light which is within the critical angle $\theta_c$ for the structure material to air will escape the pyramid surface. This exitant light will also be approximately Lambertian, having a constant radiance or luminance. This implies that rays emitted in a certain small area of the pyramid will have an approximate cosine dependence on luminous or radiant intensity.

As both the outside mirror coating surfaces and pyramid surfaces are assumed to be specular, one can observe that the dashed ray path leading to emission angle $\theta_b$ with respect to the surface normal will be largest if the emission point from the right-hand pyramid is just below the mirror coating 4. Light generated in the location above this point will be reflected back into the pyramid by the mirror coating 4. Light generated below this point will be partially reflected from either the mirror coating 4 or uncoated pyramid surface parts of the neighbor pyramid. Thus, the maximum emission angle $\theta_b$ will be determined by the ray path shown for emission at E. Light generated along the solid ray path is direct emission from E that is not reflected from any surface. The maximum emission angle for this ray angle is $\theta_a$. All other light will be directly recycled into the neighboring pyramid as shown by the dashed-dot line. The final extent of the emitted angular distribution from the structure will be determined by the maximum of $\theta_a$ and $\theta_b$.

Restricting the ray geometry to two dimensions, one can derive simple formulas for the maximal rays in FIG. 3. These angles are given by $$\sin\theta_a = \frac{1}{\sqrt{1+\left(\frac{h_2}{2h\tan\square}\right)^2}}$$

and $\theta_b=\pi/2-\theta_a$, where the maximum emission angle qem is determined by $\theta_{em}=\max(\theta_a, \theta_b)$.

For example, a typical ratio of the mirror height h2 to the pyramid height h is about 0.25. The pyramid height h is, for example, about 20 µm, and the angle ϕ may be around 20°.

Figure 4:
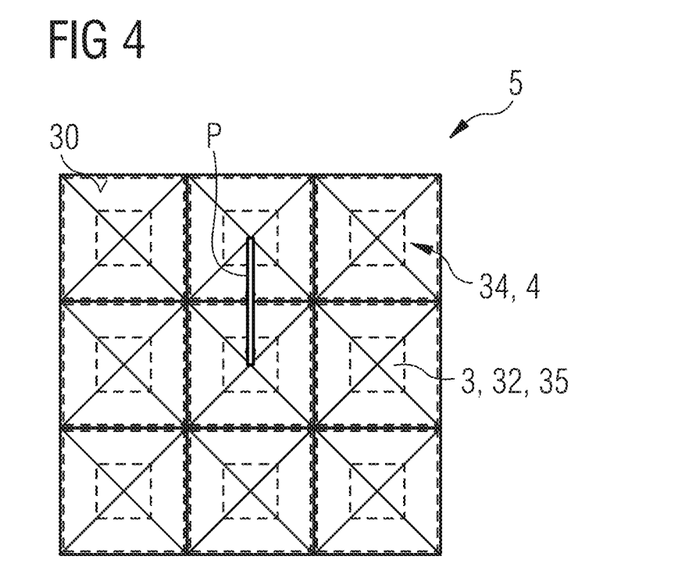
FIG. 4 is a schematic top view of an exemplary embodiment of a cover body for semiconductor light sources described herein.

In FIG. 4, an exemplary top view of the inverted pyramid structure of the device of FIGS. 1 to 3 is provided. For example, the pyramid-shaped recesses 32 are arranged in a square pattern. Between the recesses 32, there are virtually no flat areas at the emission side 30, but there are only the edges between adjacent recesses 32.

Figure 5:
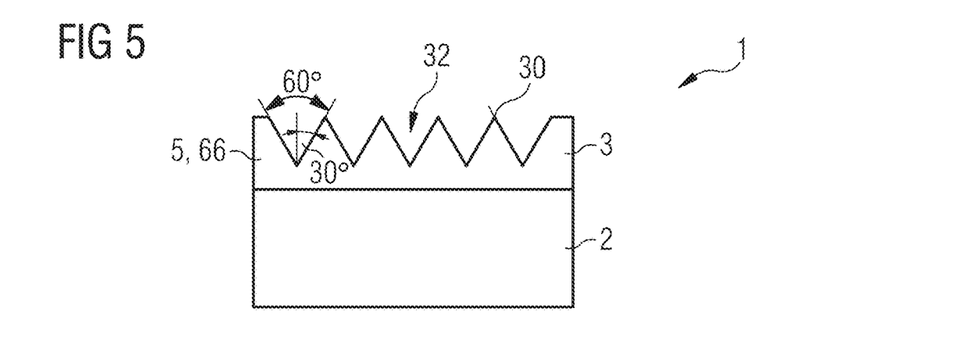
FIG. 5 is a schematic sectional view of an exemplary embodiment of a semiconductor light source described herein.
Figure 6:
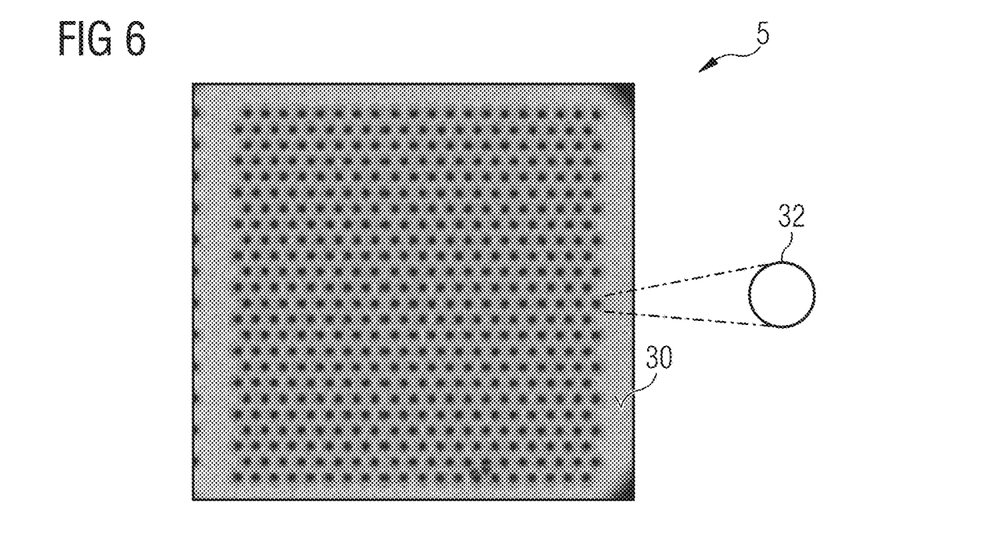
FIG. 6 is a schematic top view of the semiconductor light source of FIG. 5.
Figure 7:
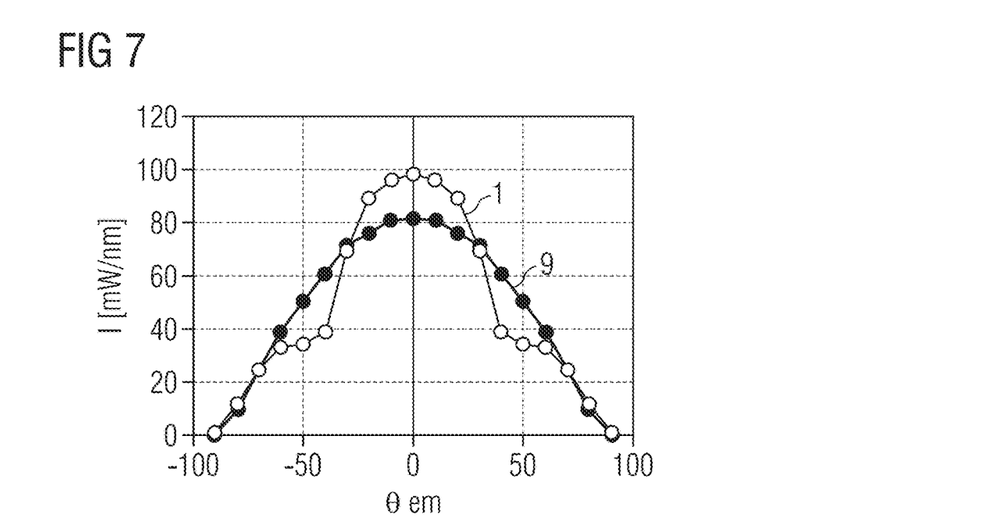
FIG. 7 is a schematic comparison of emission characteristics of semiconductor light sources.

In FIGS. 5 to 7, another exemplary embodiment is illustrated. In this semiconductor light source 1, the recesses 32 have the shape of inverted cones. As an option, the recesses 32 do not completely run through the base body 3 but penetrate the base body 3 for at least 60% and at most 85%. The cover body 5 may be directly attached at the semiconductor chip 2, or there is an adhesive, not shown.

As an option, the cover body 5 may include a wavelength conversion material 66. Thus, the cover body 5 may simultaneously be the wavelength conversion means.

For example, the circular recesses 32 are arranged in a hexagonal grid. Between adjacent recesses 32, the emission side 30 may be flat. Moreover, there can be an edge region of the emission side all around the recesses 32 so that the edge region is free of the recesses 32.

In FIG. 7 it is illustrated that by means of the cover plate 5 having the recesses 32 and the reflective coating 4, an integrated output power I can be increased at small emission angles $\theta_{em}$, compared with a modified device 9 without recesses.

Otherwise, what has been stated for FIGS. 1 to 4 may also apply to FIGS. 5 to 7, and vice versa.

Figure 11:
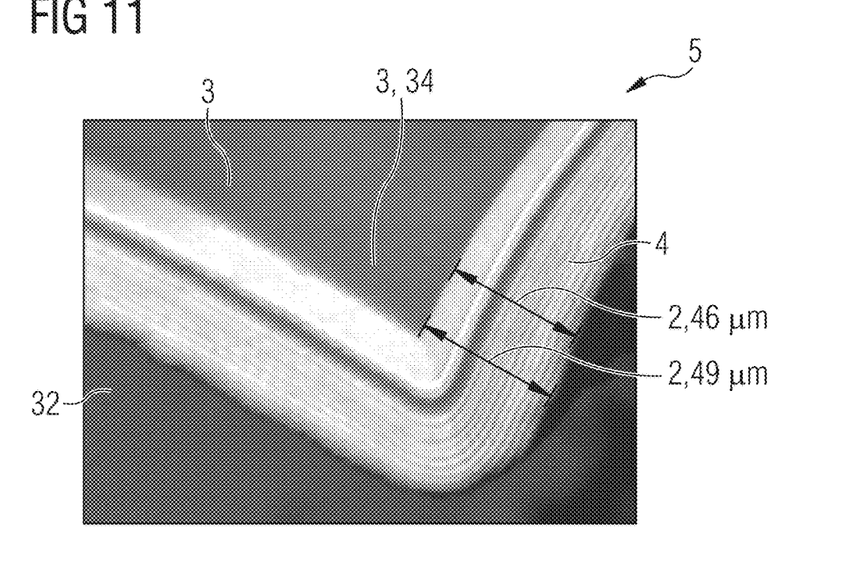
Figure 12:
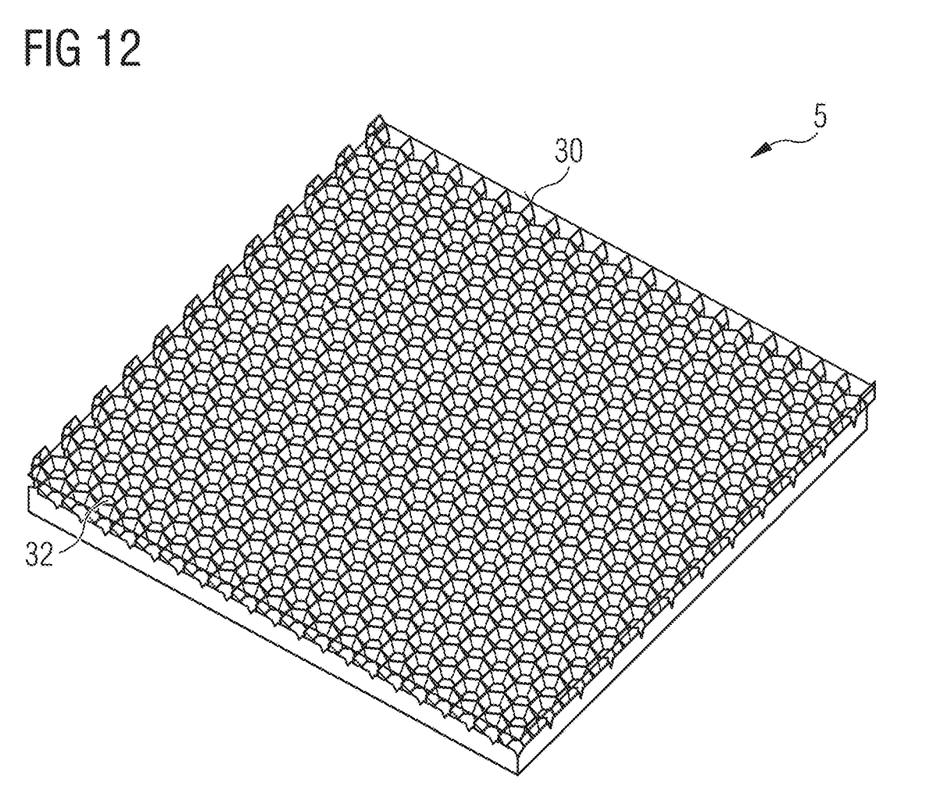
FIG. 12 is a schematic perspective view of an exemplary embodiment of a cover body for semiconductor light sources described herein.
Figure 13:
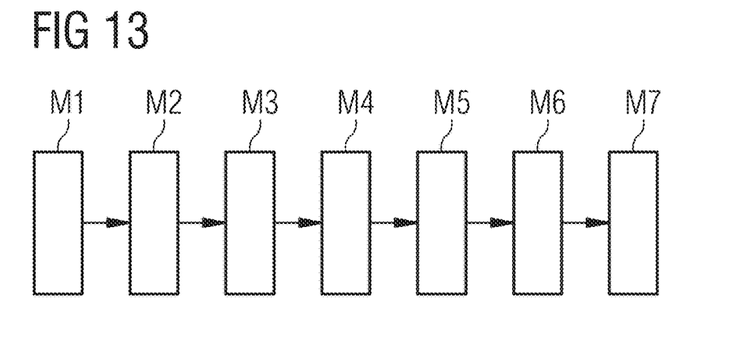
FIG. 13 is a schematic block diagram of an exemplary embodiment of a method to produce cover bodies described herein.

In connection with FIGS. 8 to 12, a method to produce the cover body 5 is illustrated in more detail, compare also the block diagram of FIG. 13.

In a first method step M1, a light-transmissive base plate 39 for a plurality of the light-transmissive base bodies 3 is provided. Then, see method step M2 and FIG. 8, the recesses 32 are formed in the base plate 39 on a wafer level across a plurality of the base bodies 3. Adjacent base bodies 3 may be separated by trenches.

Figure 8:
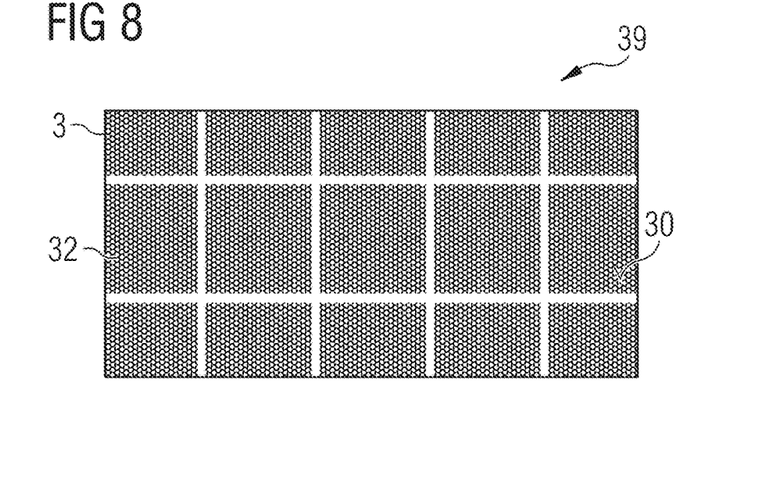
FIG. 8 is a schematic top view of a light-transmissive base plate for cover bodies described herein.

For example, the inverted cones were fabricated using laser induced deep etching technique on 4" and 6" glass wafers. The center-to-center pitch P between adjacent cones is, for example, 50 µm or 25 µm and a pitch-to-depth ratio is maintained at ≤1. The cones were arranged in a hexagonal fashion within a 1030 µm×1030 µm square for each base body 3. Thus, each square basically forms one of the cover bodies 5 and is preferably equivalent to the dimension of a white ceramic platelet 6 or LED die 2. The base bodies 3 may form a large array on a 4" or 6" or 8" or 12" wafer as shown in FIG. 8. Each single wafer could thus have thousands of such components ready for dielectric reflector coating.

Figure 9:
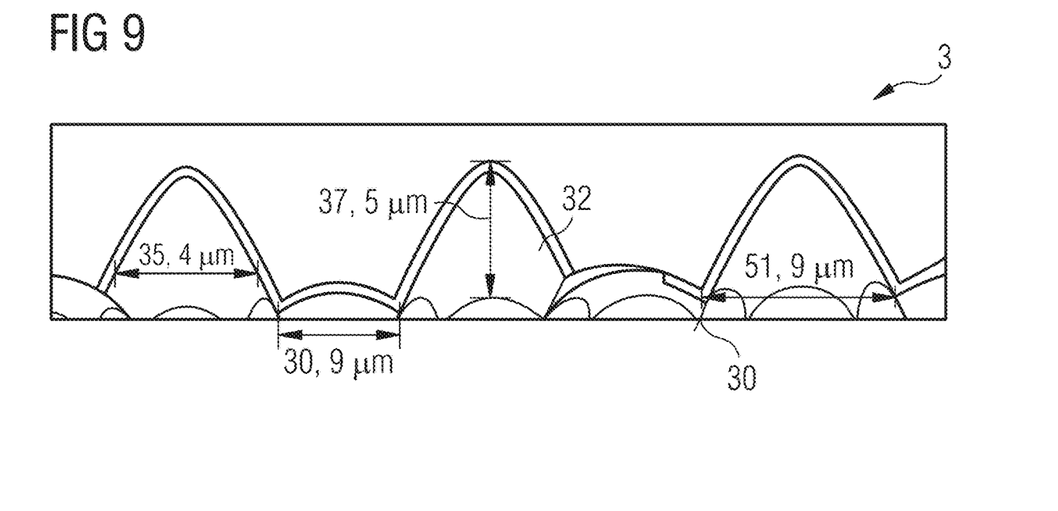
FIGS. 9 to 11 are schematic sectional views of method steps of an exemplary embodiment of a method to produce cover bodies described herein.

Exemplarily dimensions of the resulting recesses 32 are illustrated in FIG. 9. Further, in FIG. 9 method step M3 is shown. That is, the recesses 32 and, thus, the complete surface of the base bodies 3 is provided with the reflective coating 4 which is a multi-layer dielectric Bragg reflector, for example, made of alternating layers of Nb2O5 and SiO2 deposited via thin film deposition techniques such as sputtering.

Figure 10:
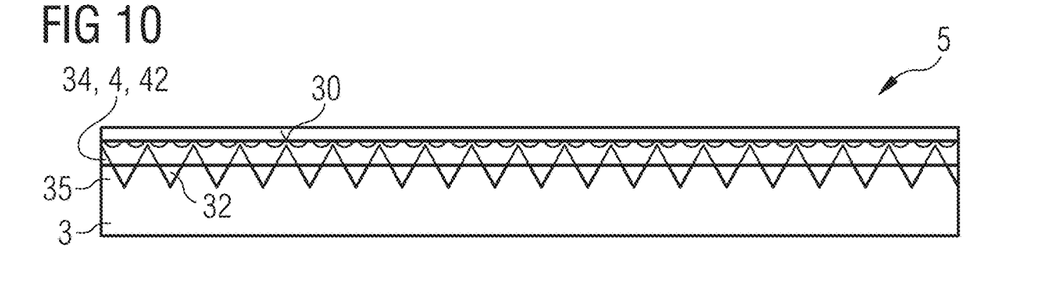

According to FIG. 10, in method step M4 a mask layer 42 is used to cover the top regions 34 of the recesses 34 and remaining portions of the emission side 30.

Thus, for example, a photoresist is spin coated uniformly on top of the mirror coating 4 covering the cones 32. This is followed by ultraviolet exposure using a photomask and a mask aligner that exposes only the bottom regions 35 of the recesses 32. After the exposure, ultraviolet exposed photoresist is removed using a standard photoresist developer and leaving reflector coating 4 at the bottom regions 35 open to air for further etching in that region. Remaining non-exposed photoresist 42 stays on the top as a mask to protect the mirror coating during the subsequent etching process performed in method step M5.

Then, in method step M6, etching of the mirror coating 4 is done, for example, using CHF3/Ar/O2 or CH4F8/Ar/O2 or CF4/Ar/O2 reactive ion etching chemistry in a reactive ion etching tool, not shown. The resulting structure is shown in FIG. 11 wherein only one of the top regions 34 is shown. In FIG. 11 it can be seen that the mirror coating 4 is indeed of multi-layer fashion.

Finally, in method step M7 the base plate 39 is diced so that the individual cover bodies 5 result, compare also FIG. 12. To simplify the drawing, in FIG. 12 the mirror coating is not shown.

As an option, the base plate 39 may be applied on a semiconductor wafer comprising a plurality of the semiconductor chips 2 and/or on a wavelength conversion means wafer prior to dicing. Thus, it is possible that dicing of the semiconductor wafer and/or of the wavelength conversion means wafer is done simultaneously with the dicing of the base plate 39.

For example, in a first preferred embodiment, the method can be summarized as follows:

A glass substrate such as SCHOTT AF32 was first treated with nanosecond and femtosecond lasers at the desired locations. For one individual die component having dimension 1.03 mm×1.03 mm, 480 laser treated locations to produce ~50 μm diameter×~47 μm deep cones in a hexagonal geometry were used. The diameter and depth of the cones were created by hydrofluoric acid-based chemistry by controlling the etching time. If one assumes about 5000 such individual die components on a single 4" wafer, then there will be ~2.4 million laser treated regions needed before the etching process.

For example, in a second preferred embodiment, the method can be summarized as follows:
1. Ultrasonically clean the inverted cones recesses on a glass wafer substrate, for example, having 50 μm diameter cones;
2. Coat the structured substrates as mentioned in 1 above with the mirror coating, which is a multilayer dielectric or a metal material;
3. Spin coat positive photoresists such as R1805 or R1813, for example, with 1500 rpm for 90 s;
4. Bake the wafer at 115° C. for 90 s;
5. Expose the photoresist using the specific photomask designed to block part of the inverted cone pattern on the substrate;
6. Develop the exposed area using photoresist developer such as MF316 for 90 s, rinse with deionized water and dry with N2 flush. At this point, the remaining photoresist works as a mask and is protecting top part of the cone recesses from etching chemistry;
7. Etch the mirror regions not protected by photoresist using selective chemistry either using dry ICP-RIE technique or by wet etching;
8. Strip remaining photoresist by spraying acetone and dry;
9. Characterize, for example, by scanning electron microscope, optical microscope, transmittance, or color over angle, to make sure high quality coating of the mirror on the top region of the cone recesses.

Alternatives would be to use different dielectric material stacks or a metal mirror as the mirror coating 4. The metal mirror would preferably have dielectric enhancement layers.

Compared with a cover plate without the recesses, the number of dielectric layers of the mirror coating can be reduced, for example, to at most 100 layers or to at most 50 layers or to at most 30 layers. Otherwise, directional emission using dielectric layer stacks without implementing structured surfaces and apex mirror coating would require deposition of hundreds of layers and very thick coatings.

Otherwise, what has been stated for FIGS. 1 to 7 may also apply to FIGS. 8 to 13, and vice versa.

Figure 14:
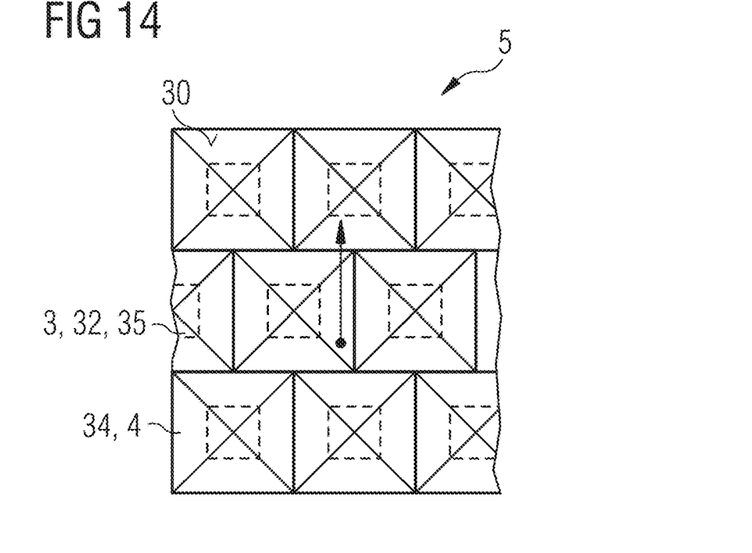
FIGS. 14 and 15 are schematic top views of exemplary embodiments of cover bodies for semiconductor light sources described herein.

In FIG. 14, another possibility to arrange the recesses 32 is shown. Thus, according to FIG. 14, the recesses 32 are of pyramidal shape and are arranged in a hexagonal grid.

Otherwise, what has been stated for FIGS. 1 to 13 may also apply to FIG. 14, and vice versa.

Figure 15:
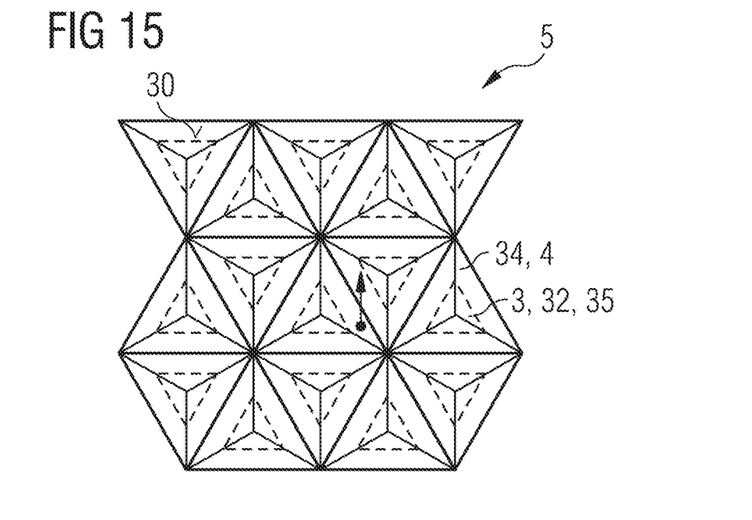

According to FIG. 15, the recesses 32 have the shape of pyramids with an equilateral triangle as a base area, and the recesses 32 are again arranged in a hexagonal grid.

Otherwise, what has been stated for FIGS. 1 to 14 may also apply to FIG. 15, and vice versa.

Other than shown, as in all other exemplary embodiments, the cover body 5 of FIGS. 14 and 15 may be configured as a wavelength conversion means, as in FIG. 5.

Thus, the structured surface can be formed in a structured phosphor plate surface. In the case of ceramics, one can use a variety of methods to structure the surface of the phosphor plate. If the ceramic is made using green-state forming processes such as tape-casting or injection molding, embossing or molding techniques can be applied to the green-state surface. If the shrinking during sintering is isotropic, then the aspect ratio of the structure will be maintained from the green state forming. The structured surface can also be made directly into a fully or partially sintered ceramic via laser machining. However, such processes may require additional annealing steps to eliminate local surface damage from the laser processing. In either case, the partial coating can be made as before, or also by filling the bottom regions 35 with a temporary filler material that can be cured before application of the mirror coating 4. After the coating, the filler material is removed with appropriate solvents or other processes that do not damage the reflective coating. The same can apply to all other embodiments, too.

In another embodiment, where the phosphor plate consists of or comprises phosphor powder in an organic curable matrix such as silicone, optical epoxy, or polysiloxanes, embossing or molding processes can be used to form the structured surface directly into the matrix material. Additionally, in some cases, the phosphor material, like powder in matrix material, may be coated onto a transparent substrate which already has the surface structure on the opposite side. This smooth, phosphor side is glued to the LED chip, for example. The dielectric coating may be applied to the structured side before application of the phosphor, after application of the phosphor, or after gluing the assembly to the LED chip.

Figure 16:
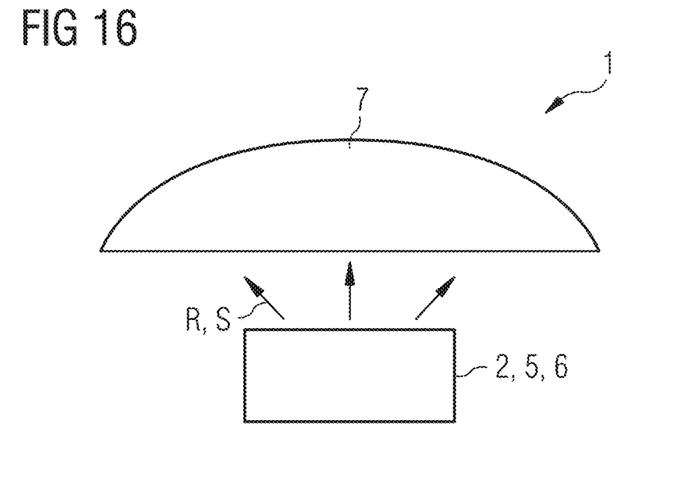
FIG. 16 is a schematic sectional view of an exemplary embodiment of a semiconductor light source described herein.

In FIG. 16 it is shown that the semiconductor light source 1 comprises the arrangement including the optoelectronic semiconductor chip 1 and the cover body 5 and optionally the wavelength conversion means 6, Moreover, the semiconductor light source 1 includes optics 7 which are illustrated in a simplified manner as a lens. Thus, the semiconductor light source 1 can be a projector, for example. By using the cover body 5, an emission angle of the semiconductor chip 1 and the optional wavelength conversion means 6 is reduced so that optical imaging can be improved and/or so that the optics 7 can be made smaller than without the cover body 5.

Figure 17:
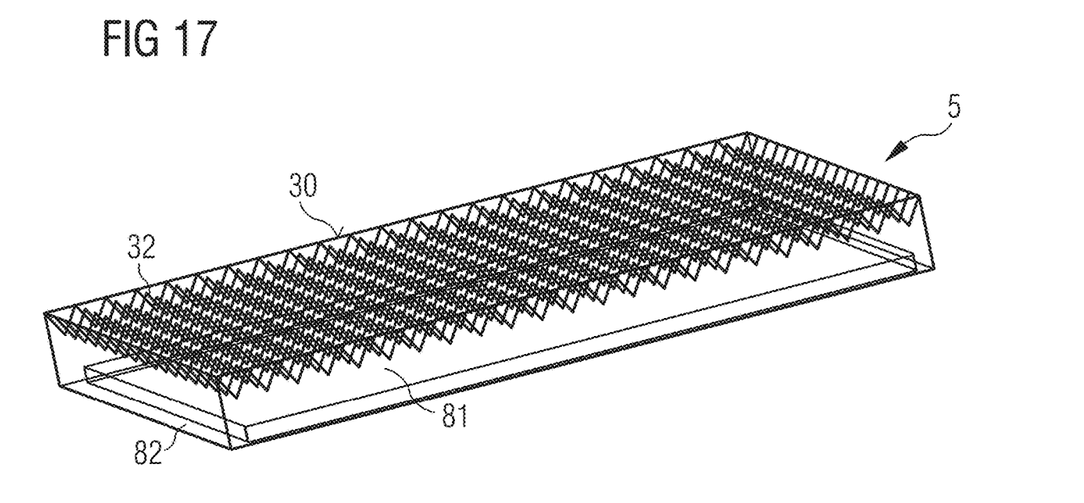
FIG. 17 is a schematic perspective view of an exemplary embodiment of a cover body for semiconductor light sources described herein.

In FIG. 17, another exemplary embodiment of the cover body 5 is illustrated. In this case, the cover body 5 comprises a bottom recess 81 which is created, for example, by etching. The bottom recess 81 is on a side of the cover body 5 opposite the recesses 32 having the mirror coating 4. Preferably, the exactly one bottom recess 81 is framed all around by a rim 82. The bottom recess 81 can be of constant depth and the rim 82 can be of constant height and/or of constant width. For example, the bottom recess 81 is of cuboid shape and the rim 82 forms a rectangular frame all around the bottom recess 81. It is possible that an area of the bottom recess 81 is at least 70% or at least 85% of an overall area of the cover body 5, seen in top view of the bottom recess 81.

For example, the cover body 5 is mounted onto the wavelength conversion means 6, not illustrated in FIG. 17, such that it is bonded on edges of the wavelength conversion means 6 or outside of the wavelength conversion means 6. Thus, because of the bottom recess 81 an air gap can be created between the wavelength conversion means 6 and the cover body 5 in the region of the bottom recess 81. By means of such an air gap, the emission angle Dem may further be narrowed. For example, a thickness of the air gap is at least ☐em and/or at most 100 µm, for example, between 5 µm and 50 µm inclusive.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

The semiconductor light source and the cover body described here is not restricted by the description on the basis of the exemplary embodiments. Rather, the semiconductor light source and the cover body encompass any new feature and also any combination of features, which includes in particular any combination of features in the patent claims, even if this feature or this combination itself is not explicitly specified in the patent claims or exemplary embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor light source comprising:
   an optoelectronic semiconductor chip configured to emit radiation; and
   a cover body arranged on the optoelectronic semiconductor chip,
   wherein the cover body comprises a light-transmissive base body,
   wherein the light-transmissive base body comprises a plurality of recesses with inclined side faces, the recesses start at an emission side of the light-transmissive base body remote from the optoelectronic semiconductor chip and narrow towards the optoelectronic semiconductor chip,
   wherein a mirror coating is provided at top regions of the recesses next to the emission side,
   wherein bottom regions of the recesses closest to the optoelectronic semiconductor chip are free of the mirror coating, and
   wherein a height of the mirror coating is between 10% and 40% inclusive of an overall height of the recesses.

2. The semiconductor light source according to claim 1, wherein the recesses are of pyramidal shape or of conical shape.

3. The semiconductor light source according to claim 1, wherein the overall height of the recesses is between 5 µm and 50 µm inclusive.

4. The semiconductor light source according to claim 1, wherein, seen in cross-section, a half-angle between the inclined side faces of the recesses is between 12° and 35° inclusive.

5. The semiconductor light source according to claim 1, further comprising a wavelength converter configured to convert at least part of the radiation into secondary radiation, wherein the wavelength converter is arranged between the optoelectronic semiconductor chip and the cover body.

6. The semiconductor light source according to claim 5,
   wherein the wavelength converter is a plane-parallel plate, and
   wherein the cover body is attached to the wavelength converter by a first adhesive arranged between the cover body and the wavelength converter.

7. The semiconductor light source according to claim 5,
   wherein the cover body comprises a bottom recess on a side opposite the plurality of recesses and facing the wavelength converter, the bottom recess is surrounded by a rim,
   wherein an air gap is located between the cover body and the wavelength converter,
   wherein the wavelength converter is at least partially located in the bottom recess and at least partially surrounded by the rim, or the rim is located on a side of the wavelength converter facing the cover body.

8. The semiconductor light source according to claim 1, wherein the cover body comprises a wavelength conversion material configured to convert at least part of the radiation into secondary radiation.

9. The semiconductor light source according to claim 1, wherein the mirror coating is a broadband dielectric multi-layer mirror.

10. The semiconductor light source according to claim 1, wherein, seen in top view of the emission side, the recesses are of rectangular, trigonal, hexagonal, elliptic or circular fashion.

11. The semiconductor light source according to claim 1,
    wherein, seen in cross-section, the recesses are of symmetric fashion, and
    wherein the recesses run through at least 50% of the light-transmissive base body, in a direction perpendicular to the emission side.

12. The semiconductor light source according to claim 1, wherein, outside the recesses, the emission side is flat.

13. The semiconductor light source according to claim 1, wherein, seen in top view of the emission side, a period length of a pattern of the recesses is between 10 µm and 0.1 mm inclusive.

14. The semiconductor light source according to claim 1, wherein, seen in top view of the emission side, the recesses are arranged in a hexagonal or rectangular grid.

15. The semiconductor light source according to claim 1, wherein the optoelectronic semiconductor chip is a light-emitting diode or a laser diode configured to emit near-ultraviolet radiation or visible light.

16. A method for producing the cover body according to claim 1, the method comprising:
    providing a light-transmissive base plate,
    forming the recesses into the light-transmissive base plate so that the light-transmissive base body is created, and
    applying the mirror coating on the top regions of the recesses.

17. The method according to claim 16,
    wherein the light-transmissive base plate is a glass plate or a plastics plate, wherein the recesses are formed by laser induced deep etching of the light-transmissive base plate, and wherein the applying the mirror coating at the top regions of the recesses includes in the stated order:

completely providing the recesses with the mirror coating, providing a mask layer on the mirror coating, removing the mirror coating from the bottom regions, and removing the mask layer.

18. The method according to claim 16, wherein a plurality of the light-transmissive base bodies and an assigned mirror coating are produced on a wafer level, followed by a dicing into individual light-transmissive base bodies.

* * * * *